United States Patent [19]

Berger et al.

[11] Patent Number: 4,609,823
[45] Date of Patent: Sep. 2, 1986

[54] CHARGE TRANSFER MULTI-LINEAR STRIP

[75] Inventors: Jean L. Berger, Grenoble; Pierre Descure, Biziers, both of France

[73] Assignee: Thomson-CSF, Paris, France

[21] Appl. No.: 667,586

[22] Filed: Nov. 2, 1984

[30] Foreign Application Priority Data

Nov. 10, 1983 [FR] France ................. 83 17915

[51] Int. Cl.⁴ .................. G01T 1/24; H01L 31/00; H01L 27/14
[52] U.S. Cl. .................. 250/370; 250/332; 357/24; 357/30
[58] Field of Search .......... 250/332, 366, 370 R, 250/370 G, , 370 H, 370 I, 370 K; 357/24 LR, 30 R, 32

[56] References Cited

U.S. PATENT DOCUMENTS 4,040,076 8/1977 Kosonocky et al. ............ 357/24
4,054,797 10/1977 Milton et al. .................. 250/332
4,360,732 11/1982 Chapman et al. ............... 250/332

FOREIGN PATENT DOCUMENTS 0064890 11/1982 European Pat. Off. .

OTHER PUBLICATIONS

E. H. Snow, "Self-Scanning Photodiode Arrays for Spectroscopy", Research/Development (Apr. 1976), pp. 18-22.
Patents Abstracts of Japan, vol. 5, No. 167(E-79) (839), Oct. 24, 1981; JP-A-56 94 886 (Fujitsu K.K.) (7-3-1-1981).
Patents Abstracts of Japan, vol. 6, No. 230(E-142) (1108), Nov. 16, 1982; JP-A-57 131 179 (Matsushita Denki Sangyo K.K.) (8-13-1982).
Patents Abstracts of Japan, vol. 6, No. 160(E-126) (1038), Aug. 21, 1982; JP-A-57 79 774 (Nippon Denki K.K.) (5-19-1982).

Primary Examiner—Janice A. Howell
Assistant Examiner—Constantine Hannaher
Attorney, Agent, or Firm—Roland Plottel

[57] ABSTRACT

A charge transfer multi-linear strip comprising several lines of photosensitive detectors, each line receiving successively the radiation to be detected and comprising charge transfer shift registers which provide in phase summing of the information collected at the detectors occupying the same position in the different lines, and wherein:

said strip is adapted to radiology, the photosensitive detectors being photodiodes with a scintillator before these photodiodes and a screen being disposed to protect from the x rays the whole strip, except the photodiodes and their connections;

there is a device for charge injection of the information between each connection connected to a detector and an input of a charge transfer shift register, said device comprising especially a charge injection diode connected to one of the connections and a screen grid brought to a constant potential, said grid providing biasing of the detector.

13 Claims, 10 Drawing Figures

Prior Art
FIG_1
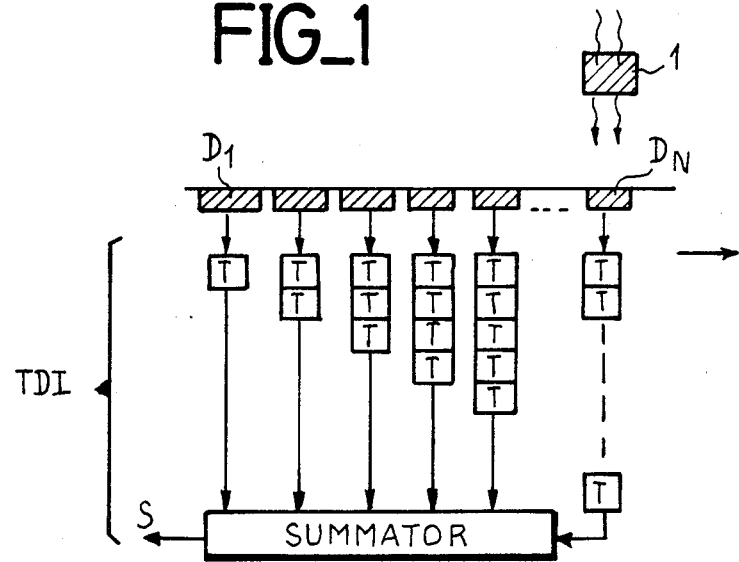
Prior Art
FIG_2
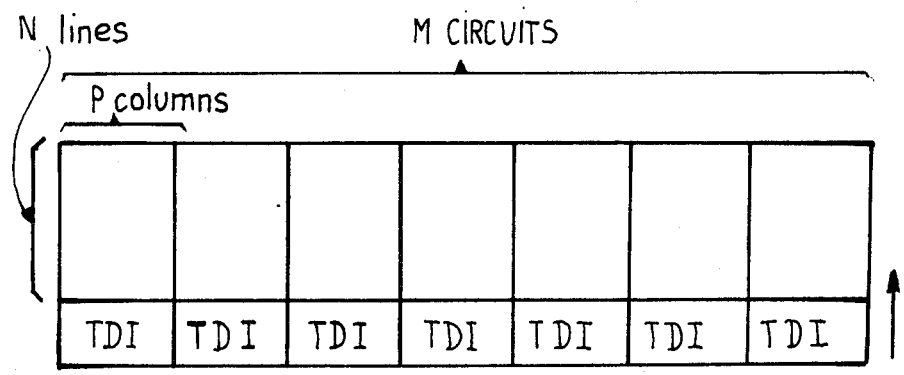

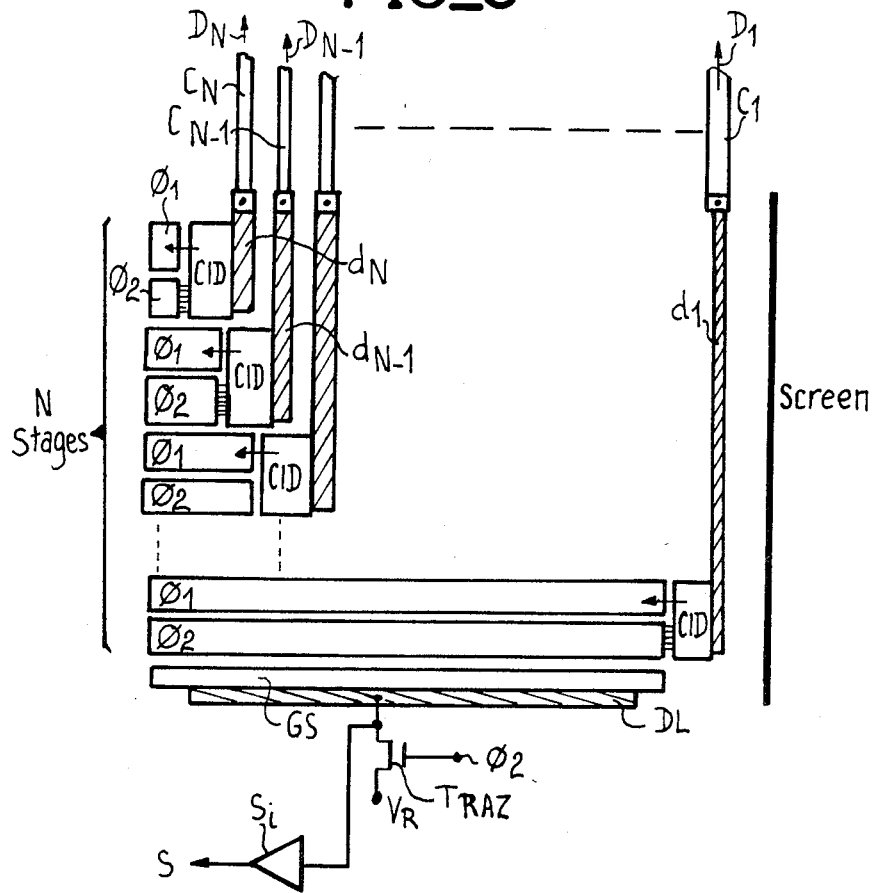
FIG_3
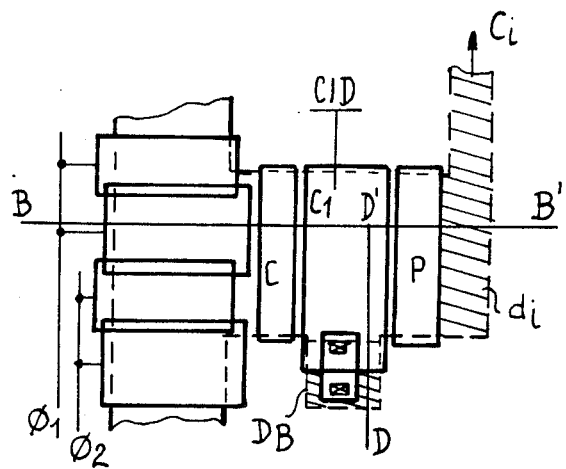
FIG_4

FIG_5
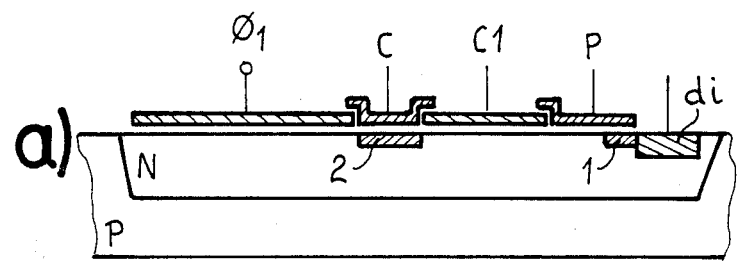
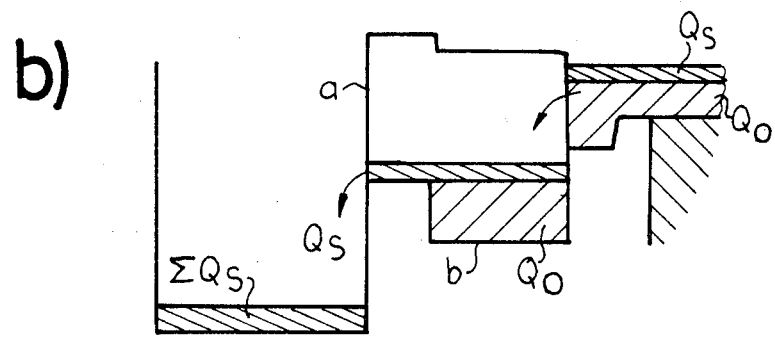
FIG_6
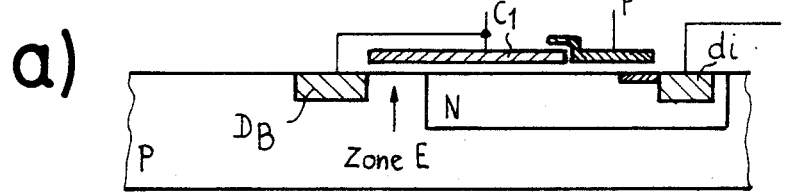
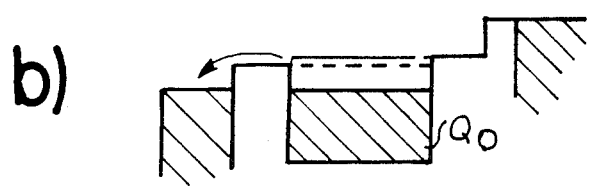

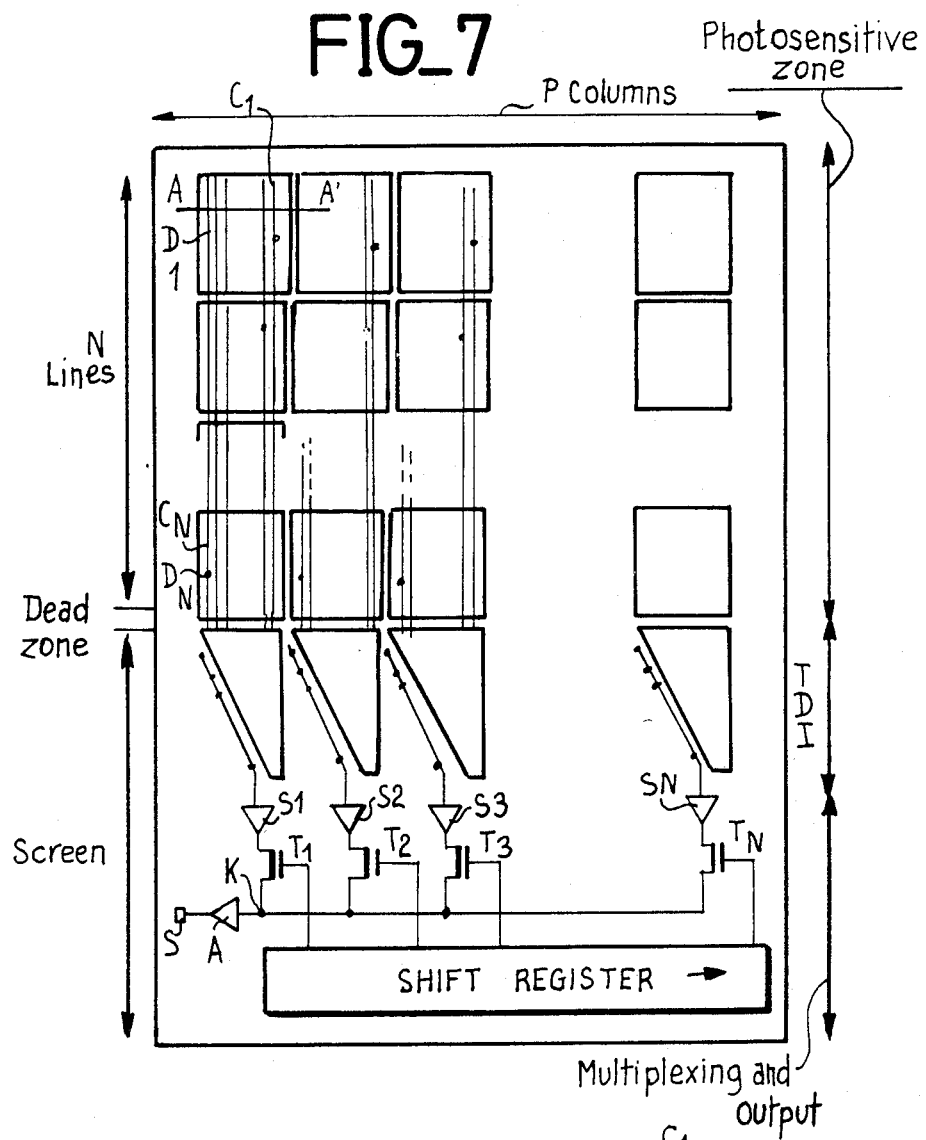
FIG_7
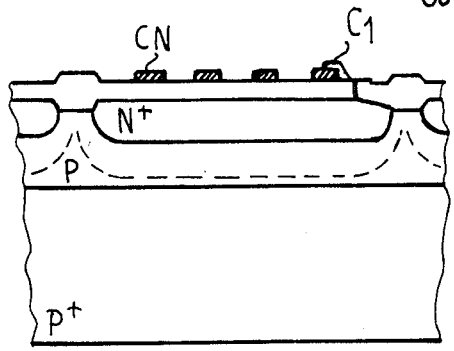
FIG_8

CHARGE TRANSFER MULTI-LINEAR STRIP

BACKGROUND OF THE INVENTION

1. Field of the Invention

The present invention relates to a charge transfer multi-linear strip.

2. Descrption of the prior art

Such strips are known in the prior art which will be described with reference to FIGS. 1 and 2.

In these strips, N aligned photosensitive elements are used, called $D_1, D_2 \ldots D_N$ in FIG. 1. These N photosensitive elements receive successively the radiation to be detected.

In FIG. 1, an arrow going from left to right shows the direction in which the strip travels in front of the object or body 1 which is emitting the radiation to be detected. The integration time is thus multiplied by a factor N provided the information collected by the different detectors is summed in synchronism with the travelling movement. For summing in phase the information collected, this information must be provided with delays of values $T, 2T, 3T \ldots NT$, where T is the time for the passage of the object or body which is emitting the radiation in front of each detector, it is also the integration time of each detector. In FIG. 1 is shown schematically that a delay T is provided for the information coming from detector $D_1$ before being fed to a summator, a delay 2T is provided for the information coming from detector $D_2 \ldots$ and so on.

The device shown in FIG. 1—apart from the detectors $D_1$ to $D_N$—is known under the name of "time delay integration" or TDI and it is by these initials that it will be mentioned hereafter.

Constructing a TDI from a charge transfer shift register with parallel inputs and a series output is known. In the example shown in FIG. 1, the information coming from detector $D_N$ is fed to the first stage of the register, then is transferred to the second stage where it is summed with the information coming from detector $D_{N-1} \ldots$ and so on.

The U.S. Pat. No. 4,054,797 shows a TDI, for infrared radiations, comprising transfer shift registers with parallel lateral inputs and a series output, the stages of these registers having a capacity increasing in the direction of the charge transfer. It is explained in this U.S. Pat., column 4, lines 6 to 12, that the information is fed to the TDI in voltage form, that is to say that the charges stored in the detectors are read as voltages and it is these voltages which control the injection of the charges into the TDI.

For forming a charge transfer multi-linear strip of great dimensions, for example 30 cm, in length, for radiology, a large number of devices such as the one shown in FIG. 1 are used. On a support, M circuits each comprising N detector lines and P detector columns are juxtaposed, with the N detectors of the same column connected to a TDI as shown in FIG. 1.

Thus, for example, a strip 50 cm in length is obtained, formed from M=50 elementary strips each comprising P=40 detector columns, and 1 cm in width, with N, the number of lines, equal to 20.

SUMMARY OF THE INVENTION

The present invention relates to a charge transfer multi-linear strip for radiology in which several problems due to the use of x-rays have been solved.

These problems are due for instance:

to the detectors, the characteristics of which have to remain stable when they receive x-rays;

to the polarization of the detectors, which cannot be realized on the photosensitive zone which receives the x-rays;

to the large capacities of the detectors and of their connections.

The present invention relates to a charge transfer multi-linear strip comprising several lines of photosensitive detectors, each line receiving successively the radiation to be detected and comprising charge transfer shift registers which provide in phase summing of the information collected at the detectors occupying the same position in the different lines, wherein:

said strip is adapted to radiology, the photosensitive detectors being photodiodes with a scintillator before these photodiodes and a shield being disposed to protect from the x-rays the whole strip, except the photodiodes and their connections;

there is a device for charge injection of the information between each connection connected to a detector and an input of a charge transfer shift register, said device comprising specially a charge injection diode connected to one of the connections and a screen grid brought to a constant potential, said grid providing biasing of the detector.

The charge transfer multi-linear strips used for collecting radiological images are especially interesting because they allow the x-ray dose used to be reduced for the same exposition time. A strip with N aligned photosensitive detectors allows to multiply by N the integration time and since the reading noises are added quadratically, a gain on the signal to noise ratio is obtained equal to the square root of N. This increasing of the signal to noise ratio allows to reduce the x-ray dose used for the same exposition time.

For collecting radiological images, the characteristics of the photodiodes used remain stable when said photodiodes receive x-rays.

It is not the case when photo-MOS are used as detectors. A scintillator is placed before the photosensitive zone, with an insulating layer between the scintillator and the photosensitive zone. Said scintillator changes the x-rays into visible light but the photosensitive zone is all the same crossed by x-rays.

According to the invention, charge injection devices or CIDs inject in the form of charges into the TDIs the information collected by the detectors, without previous conversion into voltages.

These CIDs provide impedance matching between on the one hand the large capacity of each photodiode and of the connection which connects said photodiode to the information processing part of the strip, sheltered from the radiation and then far from the photodiodes and on the other hand, the low capacity of a charge transfer shift register. An accurate and efficient injection is then realized. When the information is fed to the TDI in voltage form, only low voltages are available for controlling the injection when the capacities of the detectors and of their connections are large, as it is the case for radiological type applications and this is a disadvantage.

It is then possible as in the U.S. Pat. No. 4,054,797 to amplify the voltage which control the injection but this solution has for disadvantage to increase the space necessary to the strip.

According to the invention, a CID is used which comprises a charge injection diode connected to one of the connections and a screen grid brought to a constant potential, said grid providing biasing of the detector. So the biasing of the photodiodes is realized by CIDs which are protected from the x-rays.

The injection is further improved by different improvements such as the use of two driver charges. In a preferred embodiment, a drain is used for removing the excess charges placed at the level of the CIDs. The diodes used have a high capacity and if there is excessive illumination, it is the charge transfer shift registers which are first of all saturated. The use of removal drains at the level of the CIDs protects the registers without substantially increasing the space required.

BRIEF DESCRIPTION OF THE DRAWINGS

Other objects, features and results of the invention will be clear from the following description, given by way of non limitative example and illustrated by the accompanying Figures which show:

FIGS. 1 and 2, diagrams of the prior art, showing the connections between a TDI and detectors $D_1$ to $D_N$, and showing the general structure of a charge transfer multi-linear strip;

FIG. 3, the diagram of one embodiment of a TDI in accordance with the invention;

FIG. 4, a diagram showing in greater detail than FIG. 3 the structure of a preferred embodiment of a charge injection device;

FIGS. 5a, b and 6a, b sectional views made through the diagram of FIG. 4 and diagrams for explaining the operation;

FIG. 7, the diagram of one embodiment of an elementary strip;

FIG. 8, a sectional view of FIG. 7.

In the different Figures, the same references designate the same elements but, for the sake of clarity, the sizes and proportions of different elements have not been respected.

DESCRIPTION OF THE PREFERRED EMBODIMENT

In FIG. 3 is shown the diagram of one embodiment of a TDI. Parallel connections, vertical in the Figure, $C_1$ to $C_N$ are connected to detectors $D_1$ to $D_N$. It will be recalled that a charge transfer multi-linear strip comprises several lines of photosensitive elements. Each line receives successively the radiation to be detected. Each TDI is connected to N detectors which occupy the same position, i.e. the same column, in the different lines.

Each connection is connected through a charge injection device or CID to the input of a stage of an N stages charge transfer shift register. This register has parallel and lateral inputs and a series output.

In the embodiment shown in FIG. 3, a charge transfer shift register is used in which each stage is formed by an electrode pair connected to a control signal $\phi_1$ and an electrode pair connected to a control signal $\phi_2$. In each pair, one of the electrodes is a storage electrode and the other a transfer electrode. The disymmetry in the surface potentials required for making the transfer unilateral is provided for example by an extra oxide thickness or by implantation of impurities of the same type as the substrate.

Similarly, a register may be used having any number of control phases. In FIG. 3, the injection of the charges takes place on phase $\phi_1$.

In the embodiment of FIG. 3, the CIDs are in contact with the right hand end of the storage electrodes connected to the clock signal $\phi_1$. The CIDs could also for example, be in contact with the left hand end of these electrodes or with their upper part.

The transfer direction of the charges in the register is vertical, from bottom to top, and parallel to the connections. The stages of this register have a capacity increasing in the transfer direction. The capacity increase is achieved preferably by increasing the area of the electrodes. The capacity of the register may be doubled from one stage to the next. By means of connection $C_N$, the charges coming from detector $D_N$ are transferred into the register. These charges are transferred into the shift register from the CID connected to connection $C_N$. There is transfer of these charges to the following stage, then the transfer into this stage of the register through connection $C_{N-1}$ of the charges coming from detector $D_{N-1}$ takes place ... and so on ... the register assigning decreasing delays of values NT, (N−1). T ... . to the charges coming from detectors $D_N$ to $D_1$ and this register also summing the charges.

The arrangement adopted in FIG. 3 is particularly advantageous from the point of view of compactness of the strip.

The last stage of the register comprises a device for reading the charges.

This device may be formed for example by an output grid $G_S$, followed by a reading diode $D_L$ to which are connected a follower stage $S_i$ which supplies the output signal S and by a reset transistor $T_{RAZ}$ whose grid is controlled by the signal $\phi_2$ and which receives a DC voltage $V_R$.

As it is shown in FIG. 3, for the use in radiology, a shield opaque to the x-rays is disposed on the TDI.

In FIGS. 4, 5 and 6, is shown a preferred embodiment of the CIDs of FIG. 3.

In FIG. 4, which is a top view, it can be seen that each CID comprises:
- a charge injection device $d_i$ connected to a connection $C_i$;
- a screen grid P brought to a constant potential;
- a storage grid $C_1$;
- an injection grid C which controls the passage of the charges to the input of a charge transfer shift register;
- a diode $D_B$ for removing the charges connected laterally to the storage grid $C_1$.

FIG. 5a is a sectional view along BB' of the device of FIG. 4.

It will be noted that the CID is formed on a N/P diffusion. A P/N diffusion could also be used. The transfers therefore take place in volume, which reduces the noise. Similarly, the registers preferably comprise diffusions so that the transfers take place in volume. Under the grip P there exists a compensation 1 which partially raises the threshold and the purpose of which will explained further on. Similarly, there exists a compensation 2 under grid C.

In FIG. 5b, the profiles of potentials at two periods a and b have been shown. Increasing positive potential is in the downward direction.

During the period a, the transfer of charges takes place towards the stage of the register which is shown in FIGS. 5a and b.

Grids $C_1$ and C are at a low level.

At the injection diode $d_i$ and under the screen grid P is to be found the signal charge $Q_S$ coming from detector $D_i$.

During period b, grids $C_1$ and C are brought to high levels. There is a transfer towards these grids of a charge amount equal to $Q_S+Q_O$, where $Q_O$ forms a first driver charge for improving the transfer of the charges at the level of grid P. The driver charge $Q_O$ is retained under grid $C_1$ whereas the signal charge $Q_S$ is transferred into the register where it is added to the signal charges coming from other detectors. The high levels applied to grid $C_1$ and C are chosen so that the driver charge $Q_O$ is retained under grid $C_1$.

The screen grid P serves essentially for biasing the detectors. If defines the reference potential of the detectors at the beginning of their integration time. That occurs at each read out when the charges in excess with respect to the reference potential are transferred under grid $C_1$.

The compensation 1 straddled under grip P and which partially raises its threshold improves this decoupling between the reference potentiel and the potential under grid $C_1$.

As biasing of the detectors is realized by TDIs, a photosensitive zone is obtained with no MOS transistor and no charge device.

Under grid C, there is also a compensation 2 which raises its threshold. Thus, when grids C and $C_1$ go to the low level, the driver charge $Q_O$ is restored under grid P and diode $d_i$ and not in the register.

To improve the transfer of signal charges $Q_S$ at the level of grid C, a second driver charge $Q_1$ is used.

The driver charge $Q_1$ is preferably transferred into the CID at the same time as the signal charge $Q_S$. It may be generated by additional illumination of the detectors or, for example, by means of a charge transfer shift register or MOS transistors providing injection of an additional charge amount at the level of connections $C_1$ ... $C_N$ for example.

The second driver charge $Q_1$ is of the order of 1/10 or 1/20 of the average signal charge, whereas the first driver charge $Q_O$ is of the order of 3 to 5 times the maximum signal charge. It is transferred into the register at the same time as the signal charges $Q_S$.

The CID of FIGS. 4 and 5 forms a preferred and very much improved embodiment.

The basic embodiment of a CID comprises the diode $D_i$, the screen grid P, the storage grid $C_1$ and the injection grid C. In more improved embodiments, the compensations 1 and 2 are added under grids P and C, the system for generating the second driver charge . . . From the embodiment shown in FIGS. 4 and 5, other CID embodiments may be derived which perform less well. Similarly, the CIDs and the registers may operate with surface transfers.

In the case of use in radiology, the detectors have a high capacity. In the case of over illumination, the registers are saturated first, they may for example have a storage capacity ten times less than that of the detectors.

For space saving reasons, it is not very desirable to use removal drains at the level of the registers. It is preferred to dispose a removal drain at the level of the CIDs. In the embodiment of FIG. 4, this drain is formed by a diode $D_B$ connected to the grid $C_1$. The diode $D_B$ is placed laterally with respect to grid $C_1$. FIG. 6a is a sectional view in the direction DD', D'B' shown in FIG. 4 and FIG. 6b shows the potential profile in the case of overillumination for the device of FIG. 6a. When there is a charge excess under grid $C_1$, there is transfer towards diode $D_B$.

To obtain a good low noise transfer, the assembly of grids P, $C_1$, C as well as the charge transfer shift register are formed on a diffusion, for example N/P in FIG. 6a, so as to effect all the transfers in volume, but the diffused zone N is interrupted in zone E—see FIG. 6a—in the vicinity of diode $D_B$. The potential in this zone is such that the transfer takes place on the surface. A potential barrier is obtained which defines the maximum charge amount storable under grid $C_1$. In a variant, the diffused zone N is not interrupted in zone E, in the vicinity of diode $D_B$. In this case, there is formed under grid $C_1$, in the vicinity of diode $D_B$, a compensation which is higher than the compensation 2 existing under grid C, which allows a higher threshold in the vicinity of diode $D_B$ for modulating the charge amounts stored under grid $C_1$.

It can be seen from FIG. 3 that the diodes for injecting charges $D_1$ to $D_{N-1}$ all begin at the same level on the connections. It is possible to limit the height of the injection diodes to the size of the grids P, $C_1$, C . . . of the CIDs. The increase in area of these diodes allow the passage of connections such as those which convey the clock signals $\phi_1$ and $\phi_2$ to the adjacent TDIs.

In FIG. 7, there is shown in greater detail one of the elementary strips shown in FIG. 2 and M copies of which much be joined together so as to obtain a charge transfer multi-linear strip. The whole of the strip is formed preferably on the same semiconductor substrate.

This strip comprises a photosensitive zone formed by N lines and P columns of detectors.

It may be considered that each column forms a resolution point. In the embodiment of FIG. 7, the detectors are photodiodes having a rectangular shape about 250 microns long and 500 microns wide. The gap between the photodiodes is about 10 microns so as to increase the sensitivity to the maximum. On each detector column there are N vertical connections $C_1$ to $C_N$ which connect one of the detectors to an input of a TDI.

These connections are made from a semi transparent conductor material, polycrystalline silicon for example. They are as fine as possible so as not to reduce the sensitivity too much, for example their length is 5 microns and they are separated by a gap of 5 microns. These connections extend over the whole width of the photosensitive zone so as to balance the sensitivities of all the photodiodes.

The circuit of FIG. 7 thus comprises, following the photosensitive zone, P CID members and P TDI members, i.e. a CID and a TDI per photodiode column. A shift register addresses each of these TDIs one after the other. Addressing takes place through the grid of MOS switching transistors $T_1$ to $T_N$ connected between a common point K and the output of the follower stage $S_1$ to $S_N$ connected to the output of a TDI. These follower stages deliver a voltage across an average impedance. The point K receives successively the information from each TDI and delivers it to the output S through a low impedance output amplifier A.

The same shift register may be used for successively addressing all the TDIs of the strip comprising several elementary strips such as the one shown in FIG. 7.

The CIDs, the TDIs, and the multiplexing and output portions of the strip are protected by a screen. A dead zone is provided between the photosensitive zone and the TDIs for positioning the edge of the screen without difficulty. One advantage of the device of the invention is that biasing of the detectors is provided by CIDs which are protected from the radiation.

The photosensitive zone is preferentially formed on an epitaxied substrate, a zone P on a substrate P+ for example, as can be seen in FIG. 8 which is a sectional view of a detector along the direction AA' shown in FIG. 7. The effective thickness of the epitaxied layer is small, about 15 microns for example. The x-rays have only a small chance of being absorbed in this zone which would generate a flow of parasite charges.

What is claimed is:

1. A charge transfer multi-linear strip comprising several lines of photosensitive detectors, each line receiving successively the radiation to be detected and comprising charge transfer shift registers which provide in phase summing of the information collected at the detectors occupying the same position in the different lines, and wherein:

said strip is adapted to radiology, the photosensitive detectors being photodiodes with a scintillator before these photodiodes and a screen being disposed to protect from the x-rays the whole strip, except the photodiodes and their connections;

there is a device for charge injection of the information between each connection connected to a detector and an input of a charge transfer shift register, said device comprising especially a charge injection diode connected to one of the connections and a screen grid brought to a constant potential, said grid providing biasing of the detector.

2. Strip as claimed in claim 1, wherein each charge injection device comprises:

a grid adapted for retaining a charge amount, called first driver charge, intended to improve the charge transfer under the screen grid, said first driver charge being then restored to the screen grid and the injection diode;

an injection grid which controls the passage of the charges to the input of a stage of a charge transfer shift register.

3. Strip as claimed in claim 2, wherein, under the injection grid, there is provided a compensation which raises the threshold thereof.

4. Strip according to claim 2, wherein each charge injection device comprises a lateral removal drain formed by a diode connected to the grid which retains the first driver charge.

5. Strip according to claim 4, wherein the shift registers and the charge injection devices comprise diffusions so that all the transfers are effected in volume.

6. Strip as claimed in claim 5, wherein the diffusion in the vicinity of the lateral removal drain formed by a diode is interrupted so that the transfer takes place on the surface between the charge injection device and this diode.

7. Strip as claimed in claim 5, wherein there is provided, under the grid which retains the first driver charge in the vicinity of the lateral removal drain formed by a diode, a compensation which partially raises the threshold thereof.

8. Strip accoding to claim 1, wherein there is provided, under the screen grid, a compensation which raises partially the threshold thereof.

9. Strip according to claim 1, wherein the shift registers and the charge injection devices comprise diffusions so that all the transfers are effected in volume.

10. Strip as claimed in claim 1, which is formed on the same semiconductor substrate.

11. Strip as claimed in claim 1, formed by the juxtaposition on a support of elementary strips comprising N lines and P columns of detectors of charge transfer shift registers, of charge injection devices and of multiplexing and output members.

12. Strip as claimed in claim 1, wherein the photosensitive elements are formed on an epitaxied substrate.

13. Strip as claimed in claim 1, wherein the connections extend over the whole of the zone of the strip comprising the photosensitive elements.

* * * * *